US009341961B2

(12) United States Patent
Ning et al.

(10) Patent No.: US 9,341,961 B2
(45) Date of Patent: May 17, 2016

(54) CROSS TECHNOLOGY RETICLE (CTR) OR MULTI-LAYER RETICLE (MLR) CDU, REGISTRATION, AND OVERLAY TECHNIQUES

(71) Applicants: Guo Xiang Ning, Ballston Lake, NY (US); Arthur Hotzel, Dresden (DE); Paul Ackmann, Gansevoort, NY (US); Soon Yoeng Tan, Singapore (SG)

(72) Inventors: Guo Xiang Ning, Ballston Lake, NY (US); Arthur Hotzel, Dresden (DE); Paul Ackmann, Gansevoort, NY (US); Soon Yoeng Tan, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 364 days.

(21) Appl. No.: 13/839,894

(22) Filed: Mar. 15, 2013

(65) Prior Publication Data

US 2014/0268090 A1   Sep. 18, 2014

(51) Int. Cl.
| | | |
|---|---|---|
| G03B 27/32 | (2006.01) |
| G03B 27/54 | (2006.01) |
| G03F 1/00 | (2012.01) |
| G06F 17/50 | (2006.01) |
| G03F 7/20 | (2006.01) |
| G03F 1/70 | (2012.01) |
| G03F 1/38 | (2012.01) |
| G03F 1/50 | (2012.01) |

(52) U.S. Cl.
CPC .............. *G03F 7/70433* (2013.01); *G03F 1/38* (2013.01); *G03F 1/70* (2013.01); *G03F 7/70283* (2013.01); *G03F 1/50* (2013.01)

(58) Field of Classification Search
CPC ............... G03F 1/00; G03F 1/08; G03F 1/14; G03F 1/36; G03F 1/38; G03F 1/70; G03F 7/7015; G03F 7/70191; G03F 7/70283; G03F 7/70325; G03F 7/70433; G03F 7/7055
USPC ........... 355/53, 67, 77; 430/5, 311, 312, 322; 716/50–56
See application file for complete search history.

(56) References Cited

U.S. PATENT DOCUMENTS

| | | | | |
|---|---|---|---|---|
| 4,902,899 A | * | 2/1990 | Lin et al. ..................... 250/492.1 |
| 2002/0177076 A1 | * | 11/2002 | Komatsu et al. .............. 430/311 |
| 2003/0157415 A1 | * | 8/2003 | Ziger .................................. 430/5 |
| 2004/0067422 A1 | * | 4/2004 | Park et al. .......................... 430/5 |
| 2004/0214094 A1 | * | 10/2004 | Kim et al. .......................... 430/5 |
| 2006/0019174 A1 | * | 1/2006 | Ahn et al. .......................... 430/5 |
| 2006/0092397 A1 | * | 5/2006 | Laan et al. ...................... 355/69 |
| 2007/0065732 A1 | * | 3/2007 | Lee et al. .......................... 430/5 |
| 2007/0069387 A1 | * | 3/2007 | Kyeun ............. H01L 21/76816 257/760 |
| 2008/0311486 A1 | * | 12/2008 | Itoh .................................. 430/5 |

(Continued)

*Primary Examiner* — Colin Kreutzer
(74) *Attorney, Agent, or Firm* — Ditthavong & Steiner, P.C.

(57) ABSTRACT

Methods for reducing reticle transmission differences and for optimizing layer placement for overlay in MTRs and CTRs are disclosed. Embodiments include providing a reticle having a prime area and a frame area surrounding the prime area; determining RT differences across the prime area; and providing RT adjustment structures on the reticle to decrease the RT differences. Other embodiments include grouping multiple layers of a semiconductor production flow, the layers for each group having an RT difference less than a predetermined value; and placing the layers on plural ordered reticles of a reticle set, each reticle having multiple image fields, by selecting, for each reticle, layers from a single group and optimizing placement of the layers for overlay. Other embodiments include selectively rotating image fields on a reticle having multiple image fields to improve overlay, or optimizing placement of DDLs on CTRs by placing each design orientation on a different reticle.

7 Claims, 10 Drawing Sheets

(56) References Cited

U.S. PATENT DOCUMENTS

| | | | |
|---|---|---|---|
| 2009/0191475 A1* | 7/2009 | Lee et al. | 430/5 |
| 2009/0284721 A1* | 11/2009 | Chua et al. | 355/53 |
| 2009/0286167 A1* | 11/2009 | Tan et al. | 430/5 |
| 2013/0028505 A1* | 1/2013 | Dmitriev et al. | 382/144 |
| 2013/0295698 A1* | 11/2013 | Pforr et al. | 438/14 |

* cited by examiner

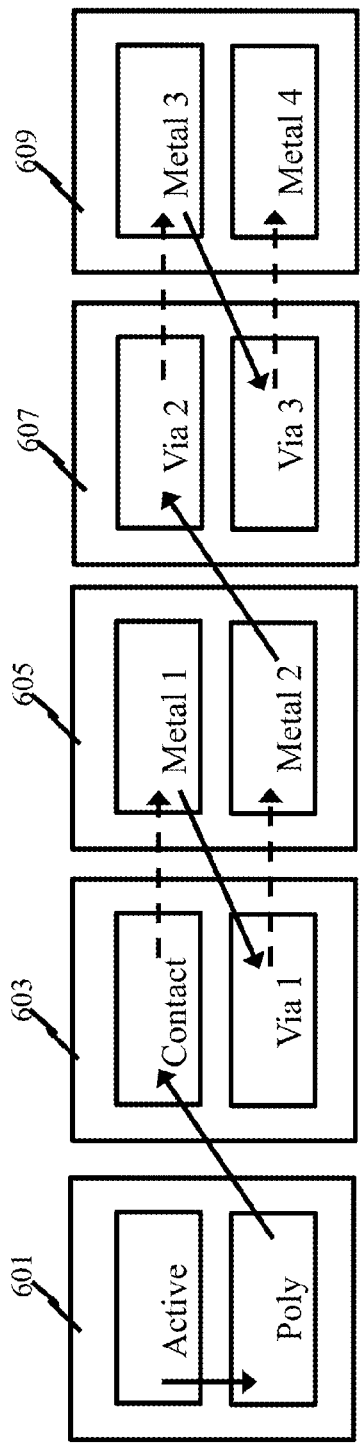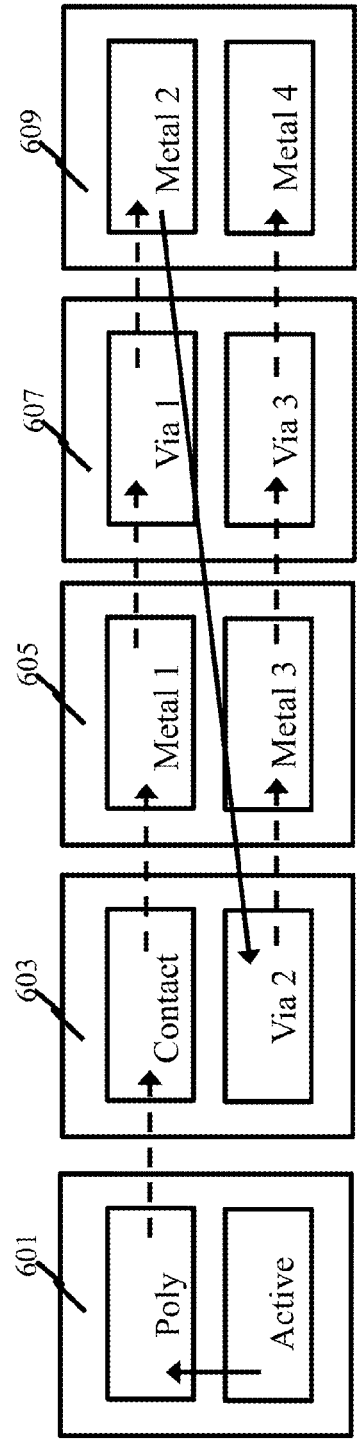
FIG. 6A
BACKGROUND ART
FIG. 6B

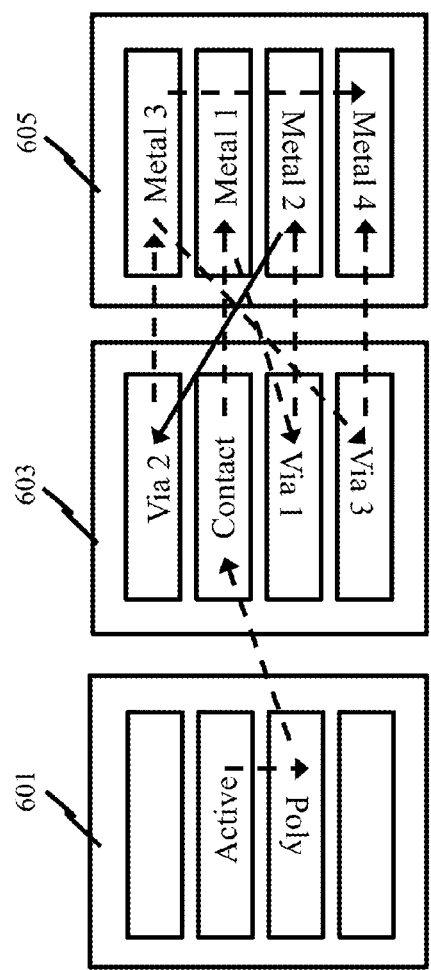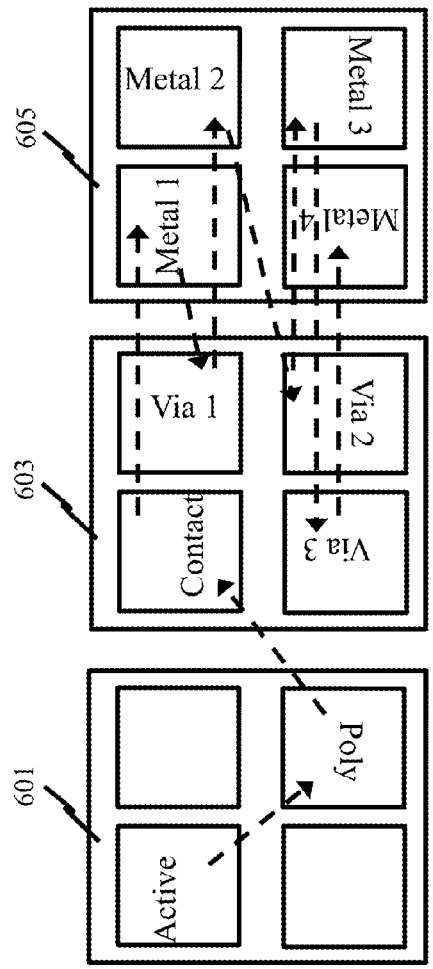
FIG. 6E
FIG. 6F

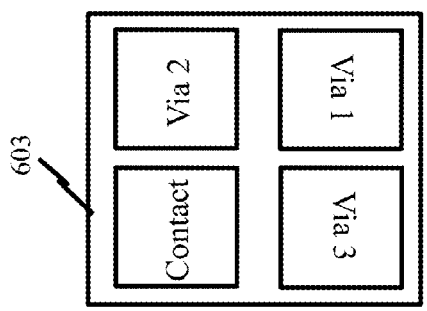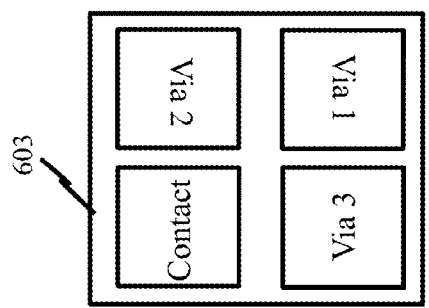

CROSS TECHNOLOGY RETICLE (CTR) OR MULTI-LAYER RETICLE (MLR) CDU, REGISTRATION, AND OVERLAY TECHNIQUES

TECHNICAL FIELD

The present disclosure relates to cross technology and multi-layer reticles. In particular, the present disclosure relates to cross technology and multi-layer reticles for 45 nanometer technologies and beyond.

BACKGROUND

An image field is a rectangular area on a reticle or photomask that has the purpose of containing pattern which is exposed in one "shot," "flash," or "scan" in the lithographic process with actinic radiation, thereby leading to the creation of the corresponding pattern in the illuminated exposure field on the processed wafer. Each image field can contain several dies, i.e. pattern-filled areas that correspond to separate chips created on the wafer. The most common type of productive reticles have only one image field which often contains several identical dies with pattern for a specific chip layer. Generally, reticles with one image field will be called single layer reticles in the following. Reticles with more than one image field with pattern for different layers are commonly called multilayer reticles (MLRs).

MLRs and cross-technology reticles (CTRs) are used to reduce reticle costs, which are a large part of the total production cost in advanced semiconductor nodes. MLRs enable different layers of the same technology node to be placed on the same reticle, which reduces the number of masks to be fabricated and, therefore, the cost of a reticle set. In addition, mask processes for both a technology node, for example the 45 nm technology node, and also the next half-node, e.g. the 40 nm technology node, are often used together. In this case, CTRs containing image fields of different technologies can be used. Thus, different technology nodes and multiple layers can be present on a single mask.

CTR or MLR pairing is limited by the differences of reticle transmission (RT) between the image fields, which cannot be greater than about 25%. RT differences greater than the recommended value will lead to the degradation of mask uniformity, mean-to-target (MTT), and registration performance during mask fabrication. For advanced technology nodes, such as 28 nm, MTT and registration for image fields in the reticle are critical, and any performance degradation will affect the final yield results. Additionally, empty fields sometimes exist on critical MLRs or CTRs, which will affect the critical dimension uniformity (CDU) and registration performance of other (functional) image fields. By increasing the number of image fields within a reticle, the risk of large RT value differences will be more challenging for both CTRs and MLRs. Further difficulties arise from the pattern density of different layers, and thus the optimum pairing of the images fields, particularly for implant layers, being difficult to predict early in the reticle tape out process. Therefore, incorrect pairings of image fields may occur, especially for CTRs.

When different layers are printed on a wafer, overlay, or the relative alignment of the images on the wafer, becomes an issue. Overlay is also very important for technology nodes below the 45 nm technology node. Image field layout, i.e. the size of image fields, their arrangement on the reticle, and the choice of image field for the different layers in the production flow (or placement of layers), can be optimized to improve overlay on the wafer. One aspect is that the difference in distortion between the left side and the right side of the scanner lens will induce additional overlay errors between layers placed on different sides of the reticle. This can be avoided by restricting the layout to a multiple row layout for 45 nm technology and below MLR or CTR pairing, as illustrated in FIG. 4. The number of image fields is decided by the data size of the customer and tape out center data handling. Note that in the common contemporary scanner types, image fields are always vertically centered to the lens during wafer exposure. Therefore possible lens distortion effects are of no concern for the vertical placement of the image fields. Another aspect is the thermal expansion of the reticle during wafer exposure by absorption of actinic radiation (reticle heating), which will affect image fields at different positions on the reticle differently. This aspect is relevant for the image field placement in both directions.

For the reduction of overlay errors from both the reticle e-beam or laser writer (i.e. reticle registration) and the wafer exposure tool or scanner, the most critical layers (especially poly, contact, and first metal) should be in the same image field of the MLR layout. FIG. 5 demonstrates that if the poly layer is in the first image field of the MLR, both the contact and metal layer also should be in the first image field of their respective reticles to reduce the overlay of poly to contact and contact to first metal. This method can be extended so that poly, contact, first metal, first via, and second metal layers are all in the same image field. If the active layer cannot be paired with the poly layer, the active layer also should be put in the first image field to improve overlay. However, strict application of this rule can lead to additional empty fields (e.g., by separating active and poly layers even if they could be paired), and thus a higher number of reticles, which in turn increases cost.

It is expected that reflective reticles, particularly EUV reticles, with more than one image field will face the same challenges as conventional (transmissive) MLRs or CTRs. This disclosure therefore applies to reflective reticles in the same way as to transmissive reticles, the only difference being that for the former, reticle transmission is to be replaced by reticle reflection. The acronym RT is therefore to be understood as meaning reticle transmission for transmissive reticles and reticle reflection for reflective reticles, respectively, throughout this disclosure A need therefore exists for methodology enabling a reduction in RT differences between image fields and optimization of layer placement for overlay without compromising cost.

SUMMARY

An aspect of the present disclosure is a method of decreasing RT differences on a reticle by providing RT adjustment structures on the reticle.

Another aspect of the present disclosure is a method of optimizing for overlay the layout of image fields on a set of MLRs.

Another aspect of the present disclosure is a method of optimizing for overlay the layout of image fields for layers with horizontal and vertical design orientation on a set of CTRs.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a reticle having a frame area and a prime area, the frame area surrounding the prime area; determining differences in RT (reticle transmission or reflection for transmissive or reflective reticles, respectively) across the prime area; and providing RT adjustment structures on the reticle to decrease the RT differences.

Aspects of the present disclosure include providing the RT adjustment structures by providing an RT adjustment area around the entire prime area, between the frame and the prime area. Further aspects include providing the RT adjustment structures by providing RT adjustment elements in the frame area and/or in the prime area in dummy filled regions. Other aspects include RT adjustment elements in the frame area differing in size from RT adjustment elements in the prime area. Additional aspects include the reticle being a multilayer reticle (MLR); and determining RT differences including determining RT differences between different layers of the MLR. Another aspect includes the reticle being a cross technology reticle (CTR); and determining RT differences including determining RT differences between image fields of different technology nodes on the reticle. Further aspects include determining RT differences including determining RT differences in different dies of a single image field; and providing RT adjustment structures including providing different numbers of RT adjustment elements in different dies. Other aspects include providing RT adjustment structures further including providing RT adjustment elements at different locations within different dies. An additional aspect includes providing RT adjustment structures including providing RT adjustment elements in an empty image field. Another aspect includes providing RT adjustment elements in an area around the prime area of the empty image field.

Another aspect of the present disclosure is a method including grouping multiple layers of a semiconductor production flow, the layers for each group using a same reticle technology or process for patterning of a corresponding reticle pattern and/or having differences in RT (reticle transmission or reflection of a corresponding reticle pattern formed on a transmissive or reflective reticle, respectively) less than a predetermined value and/or being similar in one or more other aspects; ordering the layers according to an order of the semiconductor production flow, assigning corresponding consecutive index numbers to the layers; and placing the layers on plural ordered reticles of a reticle set, each reticle having multiple image fields, by selecting, for each reticle, layers from a single group and optimizing placement of the layers for overlay.

Aspects include optimizing placement of the layers for overlay by maximizing lengths of chains of consecutive layers that are placed in a same image field on different reticles. Further aspects include optimizing placement of the layers for overlay by creating chains of consecutive layers that are placed in a same image field of different reticles and simultaneously minimizing the difference between index numbers of layers within one reticle. Other aspects include optimizing placement of the layers for overlay by maximizing lengths of chains of consecutive layers that are placed in a same image field or are rotated 180° and placed in an image field symmetric to the same image field with respect to a center of the reticle.

Another aspect is a method including optimizing image field layout for overlay by rotating the orientation of image fields depending on their position on the reticle. Aspects include a first half of the image fields on each reticle being oriented in one direction, and a second half of the image fields being rotated 180° from the one direction. An additional aspect includes each image field of each reticle being horizontally centered on the reticle. Further aspects include the image fields being arranged in a two by two layout, and the method including optimizing image field layout for overlay by rotating their orientation by 0°, 90°, 180°, or 270°, respectively, depending on their position on the reticle.

Another aspect of the present disclosure is a method including: optimizing placement of layers of a semiconductor production flow for overlay by: placing a first plurality of the layers having a first design orientation on one or more first reticles of a reticle set, with at least two of the first plurality of layers on one reticle; and placing a second plurality of the layers having a second design orientation on one or more second reticles of the reticle set, subsequent to the first reticles in the reticle set, with at least two of the second plurality of layers on one reticle. Aspects include the first design orientation being a vertical layout for an X dipole exposure; and the second design orientation being a horizontal layout for a Y dipole exposure. Further aspects include the one reticle of each of the first and second pluralities of reticles being a cross technology reticle (CTR), the method further including: vertically aligning layers on each reticle; and placing layers of a first technology node above layers of a subsequent technology node on each reticle.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 6A schematically illustrates a conventional pairing of critical layers of a semiconductor production flow on multiple MLRs of a reticle set;

FIGS. 6B through 6D schematically illustrate placement of critical layers of a semiconductor production flow on multiple MLRs of a reticle set optimized for overlay, in accordance with exemplary embodiments;

FIG. 6E schematically illustrates the optimization method illustrated in FIG. 6D extended to MLRs with 4 horizontally centered image fields per reticle, in accordance with an exemplary embodiment;

FIG. 6F schematically illustrates the optimization method illustrated in FIG. 6D extended to MLRs with a 2×2 layout, in accordance with an exemplary embodiment;

FIGS. 6G and 6H schematically illustrate different variants of optimizing image field layout by rotation of image fields for an MLR with a 2×2 layout for which only image field orientations of 0° and 180° are allowed, in accordance with an exemplary embodiment.

DETAILED DESCRIPTION

Figure 1B:
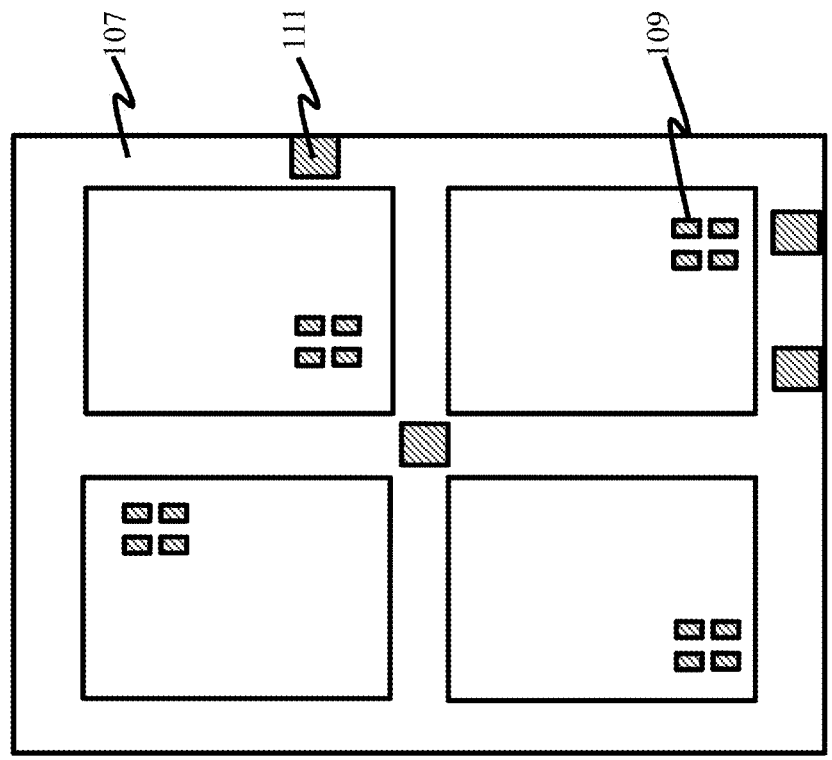
FIGS. 1A and 1B schematically illustrate reticles with different RT tuning structures, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of RT differences between image fields and overlay errors for critical layers attendant upon performing photolithography with MLRs and CTRs. In accordance with embodiments of the present disclosure, RT adjustment structures are placed on the reticle to decrease the RT differences, placement of consecutive layers of a production flow is optimized for overlay by optimizing the number of consecutive layers that are in the same image field, the image field layout of an MLR is optimized for overlay by rotating image fields depending on their position on the reticle, and placement of double dipole layers is optimized for overlay by placing different design orientations on different reticles.

Methodology in accordance with embodiments of the present disclosure includes providing a reticle having a frame area and a prime area, the frame area surrounding the prime area; determining differences in RT (reticle transmission or reflection for transmissive or reflective reticles, respectively) across the prime area; and providing RT adjustment structures on the reticle to decrease the RT differences. Other methodology in accordance with embodiments of the present disclosure includes grouping multiple layers of a semiconductor production flow, the layers for each group using a same reticle technology or process for the patterning of a corresponding reticle pattern and/or having differences in RT (reticle transmission or reflection if transmissive or reflective reticles are used for the layers, respectively) less than a predetermined value and/or being similar in one or more other aspects; ordering the layers according to an order of the semiconductor production flow; and placing the layers on plural reticles of a reticle set, each reticle having multiple image fields, by selecting, for each reticle, layers from a single group and optimizing placement of the layers for overlay.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

The RT value difference between active and poly images is generally around 14%, which is within an acceptable range for pairing the two layers (i.e. putting them together) on an MLR. However, the RT value difference for a deep N-type implant for triple well NFETs (N3 implant) and an N-well implant is greater than 25%, which will degrade mask CD uniformity when the two layers are paired on an MLR with two image fields. Therefore, although the two implant layers share the same reticle process and grade, they should not be paired on an MLR. In accordance with an exemplary embodiment, however, RT value differences can be reduced by using a flexible frame design.

Figure 1A:
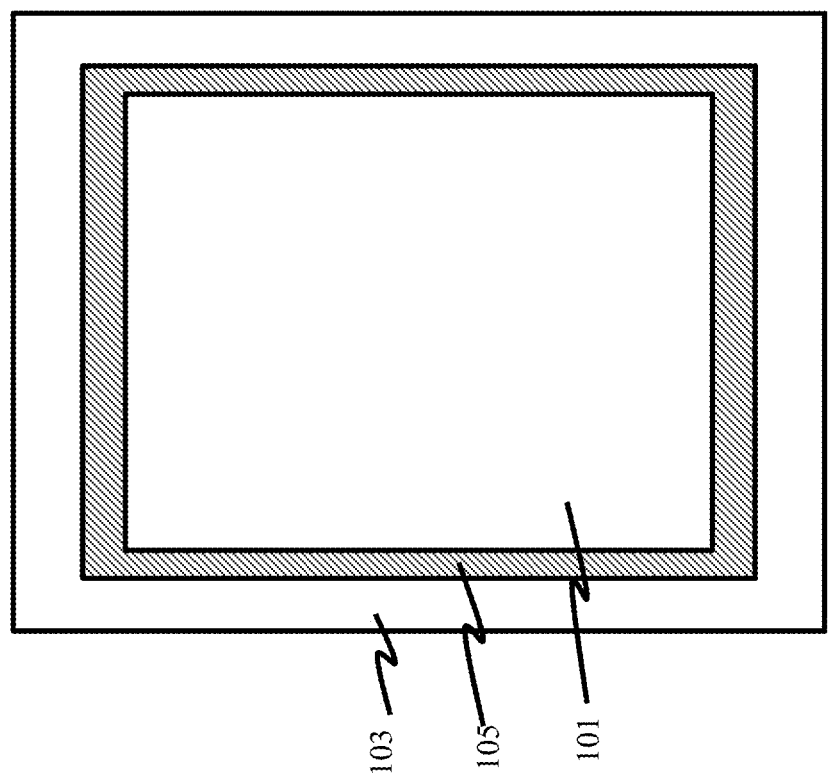

Adverting to FIGS. 1A and 1B, RT value tuning is illustrated. As shown in FIG. 1A, between a prime area 101 and a frame 103, an RT value adjustment area 105, or tunable RT, is inserted to adjust the RT value before releasing the mask for mask writing. The tapeout data preparation process can either increase or decrease the RT value at the specific region. For example, a 50 micrometer (μm) wide RT adjustment area 105 can adjust the RT value by about 3%. Alternatively, disposable elements 109 may be inserted in the prime dummy filled areas, and/or disposable elements 111 may be inserted in the frame for adjusting the RT value before releasing for mask write, as shown in FIG. 1B. Elements 109 or 111 may be, for example, 70 μm by 140 μm, and elements 109 may be the same size as or may differ in size from elements 111. The disposable elements may either increase or decrease the RT value.

An advantage of using disposable elements 109 and 111 is the ability to adjust the RT value at a late stage in data processing, for example after the average RT tuning of the respective layers or the layer pairing has been determined. In other words, RT tuning could happen as late as immediately prior to mask writing in the mask shop. If, however, the RT of the layers and the layer pairing is already known early in the tapeout process, the standard dummy fill in the active and frame regions of the layers can be adjusted to achieve RT matching between the layers. This is in contrast to using dummy fill to achieve optimum uniformity within a single layer.

Figure 2:
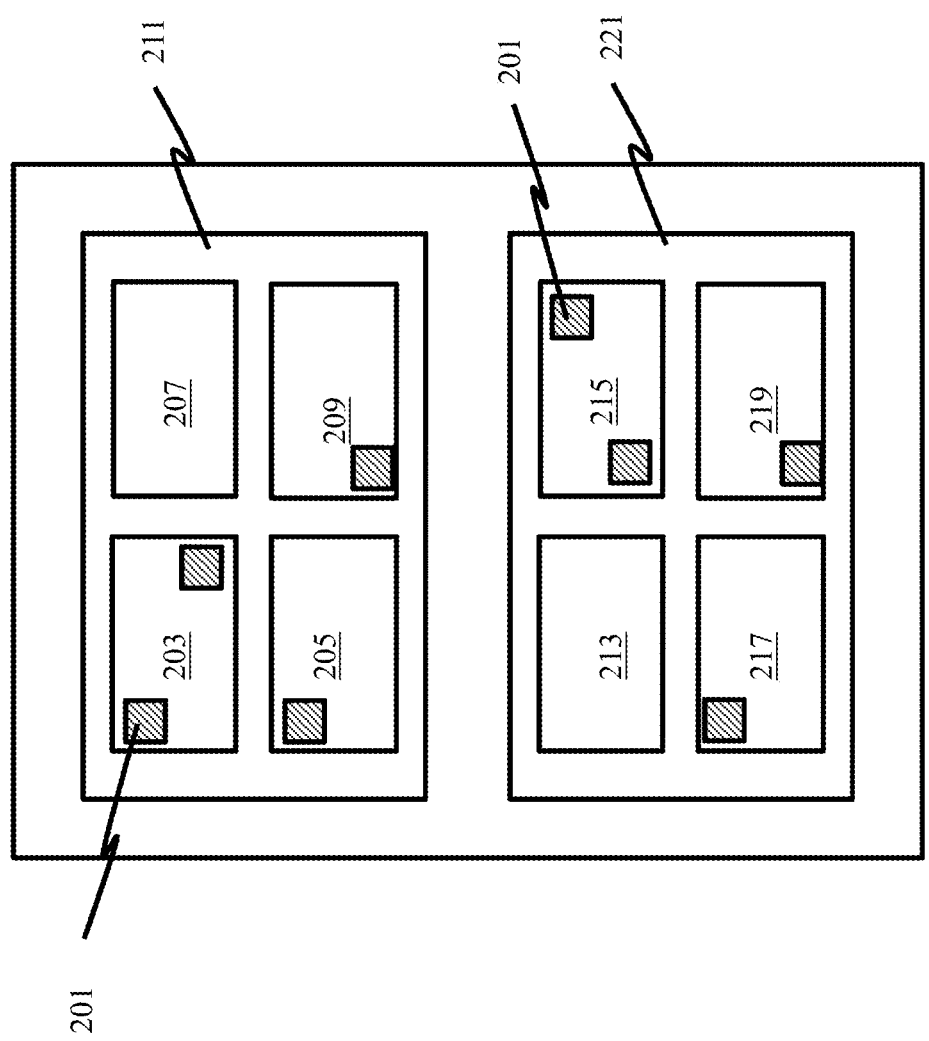
FIG. 2 schematically illustrates RT tuner adjustment for different dies in the same image field, in accordance with an exemplary embodiment.

Sometimes large RT variations or local density variations occur between different dies in the same image field. An RT tuner can adjust the die local density to make the RT of dies in the same image field as similar as possible, as illustrated in FIG. 2. For example, RT tuner elements 201 are located in various dies 203 through 209 of a first image field 211 and in various dies 213 through 219 of a second image field 221. Specifically, though dies 203 and 205 are the same and dies 207 and 209 are the same, 2 RT elements 201 are needed in die 203, one RT element 201 is needed in dies 205 and 209, and no RT elements 201 are necessary for die 207. Similarly, for first, second, third, and fourth dies 213, 215, 217, and 219 of second image field 221, the RT elements vary from zero in die 213 to two in die 215. With the RT elements in different dies of the same image fields, local density uniformity is adjusted, which improves wafer CD uniformity of different dies. The size of the RT elements 201 can differ from the frame RT tuner. Further, RT elements 201 may be used for both MLRs and single layer reticles.

For some MLR pairings, some image fields may not be used and may, therefore, be left empty. An MLR or CTR for critical layers also may have empty image fields. Empty image fields cause problems for the reticle process regarding MTT and registration. Consequently, empty image fields are normally filled by the mask shop with a large fill pattern, for example a line-space pattern with a CD of more than 100 µm and a length of several millimeters, for improved global uniformity similar to reticle layouts without empty image fields.

Figure 3C:
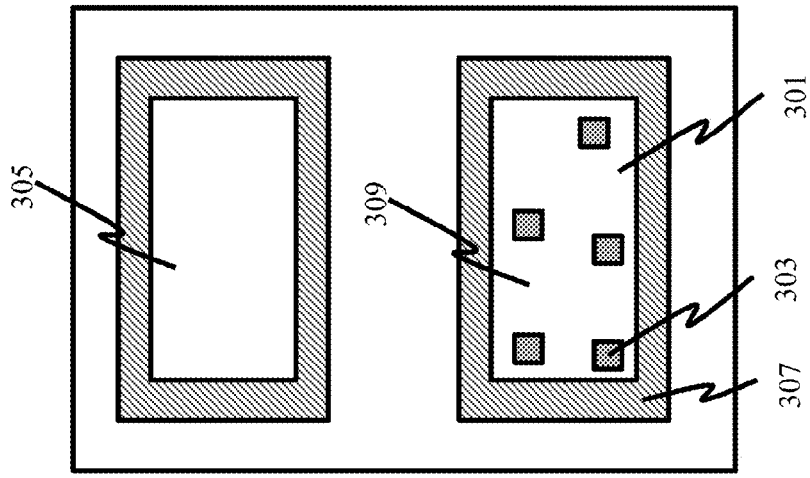
FIGS. 3A through 3C schematically illustrate an unused image field with no RT adjustment, RT tuning across the whole image field, and independent RT tuning in the frame and prime area, respectively, in accordance with an exemplary embodiment, FIG. 4 schematically illustrates a conventional multiple row layout for an MLR or CTR.
Figure 3B:
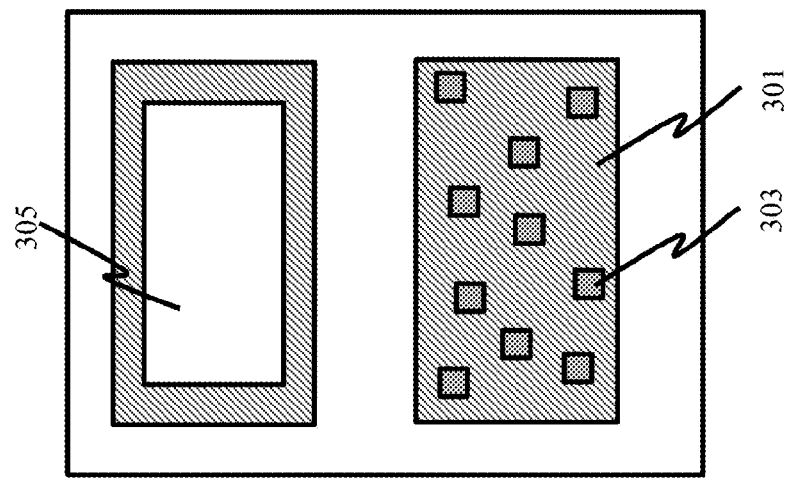
Figure 3A:
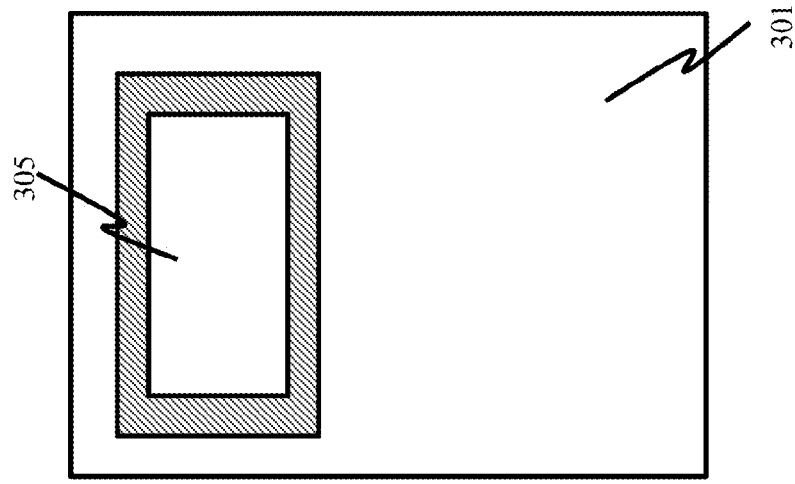

As illustrated in FIGS. 3A and 3B, RT ratio tuners can be employed to improve the CDU and registration, in accordance with another exemplary embodiment. FIGS. 3A through 3C illustrate a 1 by 2 MLR layout as an example of a bottom image field 301 being unused. In FIG. 3A, no tuner is employed for the empty image field 301. In FIG. 3B, the reticle layout includes RT tuners 303 in the unused bottom image field 301. The local density and the number of the tuners are adjusted to achieve local and global density similar to that of the upper image field 305, to improve MTT and registration. In FIG. 3C, the unused lower image field 301 includes a frame 307 surrounding a prime area 309, and RT values of the frame and prime area are independently adjusted by RT tuners 301. The embodiment of FIG. 3C may be applied for a large RT difference between the frame and the prime area, or for active or poly layers.

Figure 4:
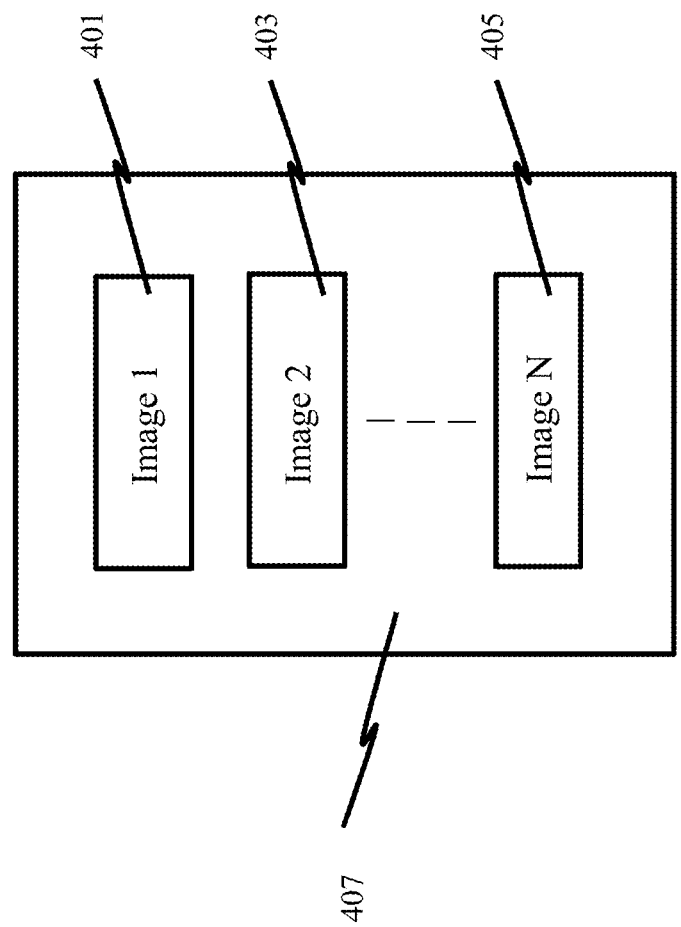
Figure 5:
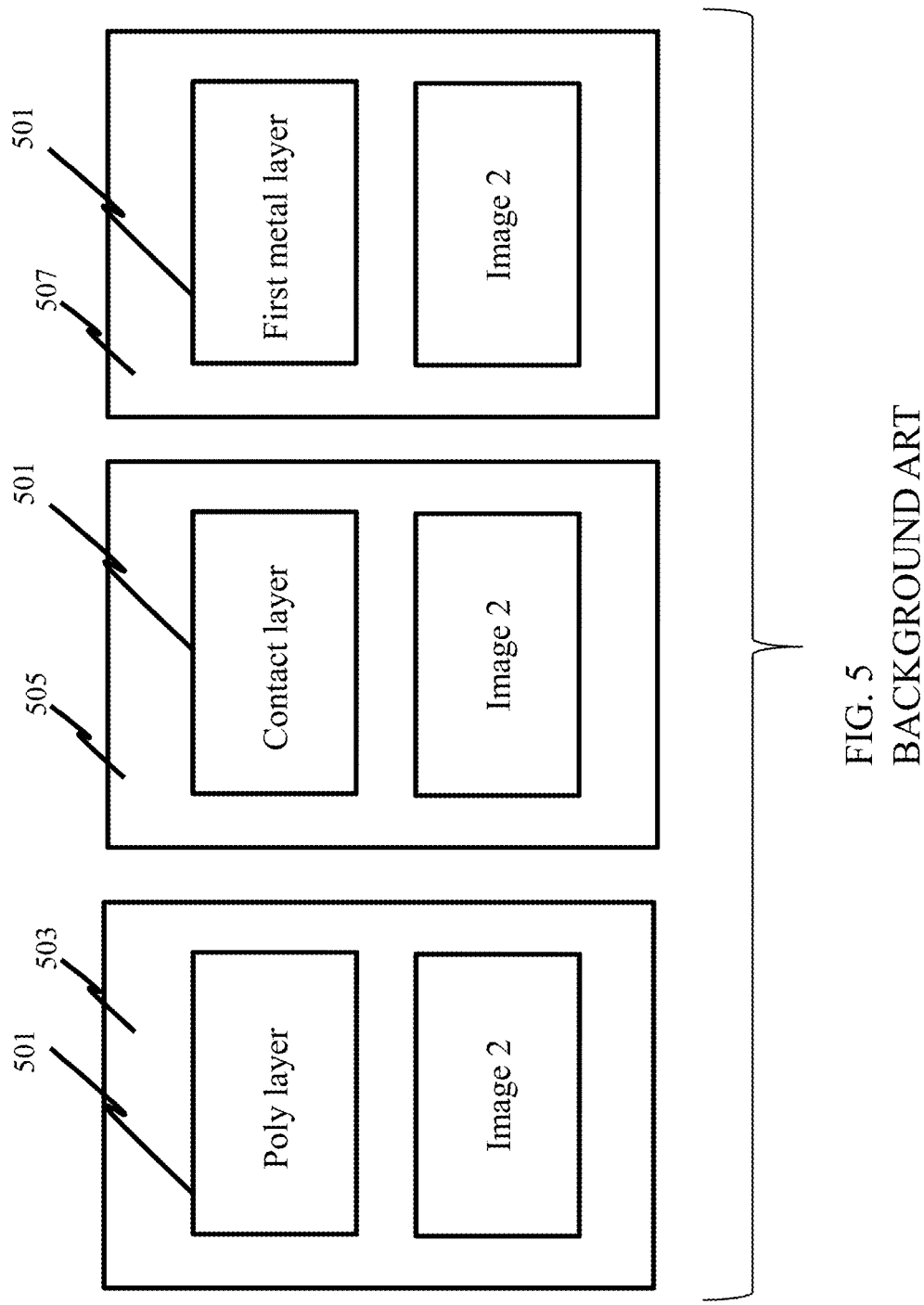
FIG. 5 schematically illustrates placement of critical layers of a semiconductor production flow in the same image field of multiple MLRs of a reticle set.

Turning to overlay error reduction, FIG. 4 illustrates a conventional multiple row layout for 45 nm technology and below MLR or CTR pairing. As shown, image fields 401 through 405 are each centered horizontally on the reticle 407, with only one image field per row (i.e., no side-by-side image fields). This solves overlay issues caused by different image field positions in the x-direction. However, overlay problems can occur through different image field positions in the y-direction as well. FIG. 5 demonstrates that if the poly layer is in the first image field 501 of a MLR 503, both the contact layer and metal layer should be in the first image field 501 of MLRs 505 and 507, respectively, to reduce the overlay of poly to contact and contact to first metal. However, as explained above, this can lead to additional empty image fields and more reticles.

During reticle exposure for patterning a wafer, the reticle heats up and expands. Scanners have ways to correct for heating, including optics which change the magnification of the exposure. However, if the exposure is not in the center of the reticle, the heating and expansion of the reticle is asymmetric and non-uniform, and the scanner optics are often ineffective for correcting the heating and expansion. Instead, the heating and expansion can be mitigated with multiple layers having good overlay. However, if the layers are placed in different image fields, asymmetric reticle heating will lead to different expansion modes, and overlay between the layers will be degraded. Accordingly, for optimum overlay, subsequent overlay critical layers of a production flow should be placed in the same image field of different MLRs.

FIG. 6A shows a conventional method of critical layer pairing. Layers are divided into different groups of layers which can be combined on one reticle, one important criterion usually being similar RT values. Consequently, not all layers can be combined with each other on a reticle. In the example of FIG. 6A, active and poly make up one group, contact and all via layers form another group, and all metal layers constitute a third group. As illustrated, active and poly layers are combined on a first reticle 601, contact and via 1 layers are combined on a second reticle 603, metal 1 and metal 2 layers are combined on a third reticle 605, via 2 and via 3 layers are combined on a fourth reticle 607, and metal 3 and metal 4 layers are combined on a fifth reticle 609. Within each group, layer pairing follows the order of the layers in the production flow. Consequently, consecutive critical layers are placed in the same image field in only about half of the cases. In the remaining cases, consecutive critical layers are in different image fields. Arrows in FIG. 6A indicate the order of the production flow, with solid arrows indicating consecutive critical layers in different image fields, and dashed arrows indicating consecutive critical layers in the same image field. Note that in the production flow there are additional, less overlay critical layers (e.g. implant layers) between some of the layers shown in FIG. 6A (namely active, poly, and contact); these layers, which belong to different layer groups, are not shown here.

Figure 6C:
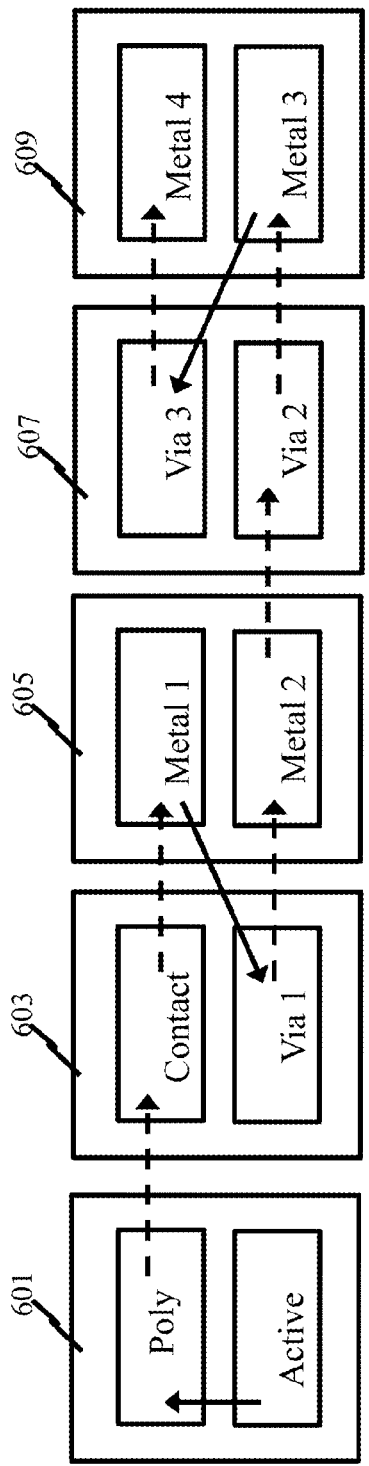
Figure 6D:
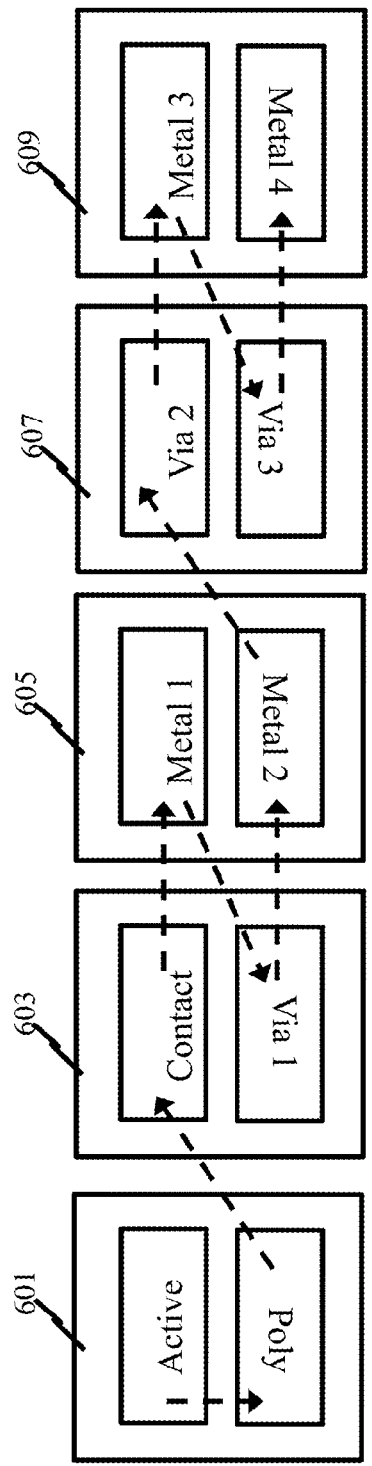

Adverting to FIGS. 6B through 6D, methods for optimizing layer placement for overlay without compromising cost are illustrated, in accordance with exemplary embodiments. As shown in FIG. 6B, the initial grouping is the same as the conventional pairing, but within the groups, the layers are rearranged to create chains of critical layers that are placed in the same image field. As such, contact and via 2 layers are paired on reticle 603, metal 1 and metal 3 layers are paired on reticle 605, via 1 and via 3 layers are paired on reticle 607, and metal 3 and metal 4 layers are paired on reticle 609. Subsequent critical layers are now in the same image field 78% of the time, as indicated by the dashed arrows. However, a disadvantage to this method is a possible delay in product introduction, since usually reticles are taped out in the order of the production flow to arrive just in time for the first wafers being processed at the different layers to save time for product introduction. This is not possible if e.g. the via 1 layer is available after the via 2 layer.

FIG. 6C illustrates an alternative method of optimizing pairing of critical layers which solves the problem of delay in product introduction. As shown in FIG. 6C, the layer pairings are the same as in the conventional method illustrated in FIG. 6A. However, the layers within some reticles are rearranged to place consecutive critical layers on different reticles in the same image field where possible. For example, the active and poly layer on reticle 601 have switched positions, as have the via 2 and via 3 layers on reticle 607 and the metal 3 and metal 4 layers on reticle 609. The percentage of consecutive critical layers in the same image field in this embodiment is 67%. The method depicted in FIG. 6C may also be described as creating chains of maximum lengths of subsequent layers in the same image fields, with the boundary conditions that the differences between layer indices (with respect to the layer order in the process flow) within the reticles has to assume minimum values. In "mixed" scenarios (not shown here), the benefits of long chain lengths and small index differences within the reticles may be balanced against each other.

For the optimization illustrated in FIG. 6D, the layer combinations and layer placements are the same as in the conventional method shown in FIG. 6A. However, the layers in the bottom fields are rotated by 180° (indicated by the labels being rotated by 180°). For exposure of the layers in the bottom fields, the reticle is rotated, so that during exposure, all layers are in the top image field. Accordingly, as indicated by all of the arrows being dashed, 100% of the consecutive critical layers are effectively in the same image field. The fundamental benefit to the optimization method of FIG. 6D is that reticle heating will thus lead to the same expansion modes for all layers. Some additional alignment marks and/or overlay marks may be required to allow wafer exposure with the reticle being in either orientation, and structure to identify the orientation of image fields for wafer exposure may also be added.

For the case illustrated in FIG. 6D, no re-ordering of the layers with respect to the conventional scenario shown in FIG. 6A is needed (to create chains of subsequent layers in the same image field), since here all layers are effectively in the same image field anyway. In this case, the rotation of image fields is therefore a "stand-alone" method of overlay optimization. However, in other cases the selective rotation of image fields may be employed to enable the creation of longer chains, as illustrated in FIG. 6E for the case of MLRs with 4 horizontally centered image fields on top of each other. The image fields in the lower half of the reticles are rotated by 180°. Overall, the thermal expansion modes of the different image fields are thus more similar than in the non-rotated case, but the expansion modes of the outer and the inner image fields still differ. Therefore, the layers have been re-shuffled between the image fields with respect to a conventional ordering (not shown), to achieve longer chains of subsequent layers that are (effectively) in the same image field. Thanks to the selective rotation of image fields, the layers can be re-ordered to achieve subsequent layers in the effectively same image field with only one exception (metal 2 to via 2).

The optimization method illustrated in FIG. 6D may also be extended to MLRs with a 2×2 layout, as shown in FIG. 6F. Image fields are rotated by multiples of 90° instead of 180°. During exposure, the reticle is rotated accordingly, so that all image fields are in the same position with respect to the scanner optics. It is noted, however, that not all scanners can support reticle rotation by multiples of 90°.

Even if only rotation by 0° or 180° is supported by the scanner, selective image field rotation can still improve the overlay performance of MLRs with a 2×2 layout, as shown in FIGS. 6G and 6H. Only reticle 603 containing the contact and via layers are depicted, but reticle 605 containing the metal layers is to be modified accordingly, while reticle 601 containing active and poly with rotations of 0° and 180° only will remain as shown in FIG. 6F. In the variant shown in FIG. 6G, the two image fields in the lower half of the reticle are rotated by 180°. During wafer exposure, with appropriate (back-) rotation of the complete reticle, all image fields will therefore effectively be in the upper half of the reticle, but either on the left hand side (contact, via 1) or on the right hand side (via 2, via 3) of the reticle. The thermal expansion modes of all image fields will thus be similar (though not fully identical), while the overlay may potentially still suffer from differences in distortion between the left hand side and the right hand side of the scanner lenses. On the other hand, as shown in FIG. 6H, the image fields in the right hand side of the reticle may be rotated (note that contact and via 1, or via 2 and via 3, respectively, may also be exchanged, since their image fields are effectively same); in the embodiment shown in FIG. 6H, all image fields will effectively be on the left hand side during wafer exposure, thus mitigating the problem of asymmetric lens distortion, but the image fields of contact and via 1 will effectively be in the upper half and the image fields of via 2 and via 3 in the lower half of the reticle, respectively, therefore the differences in the thermal expansion modes will be only slightly reduced in comparison with the non-rotated case. Which of the two arrangements is more beneficial for overlay will depend on the severity of the different effects that lead to overlay degradation.

For CTRs, layer pairing can be optimized for overlay and registration as well. In the simplest case, two technologies and two image fields per reticle, the layer of the first technology should always be in the top field, and the layer of the second technology should be in the bottom field. If there are more image fields per reticle than technologies, the layer pairing should be optimized for chains of layers with the same position in a similar way to those illustrated in FIGS. 6B through 6H.

Figures 7A, 7B:
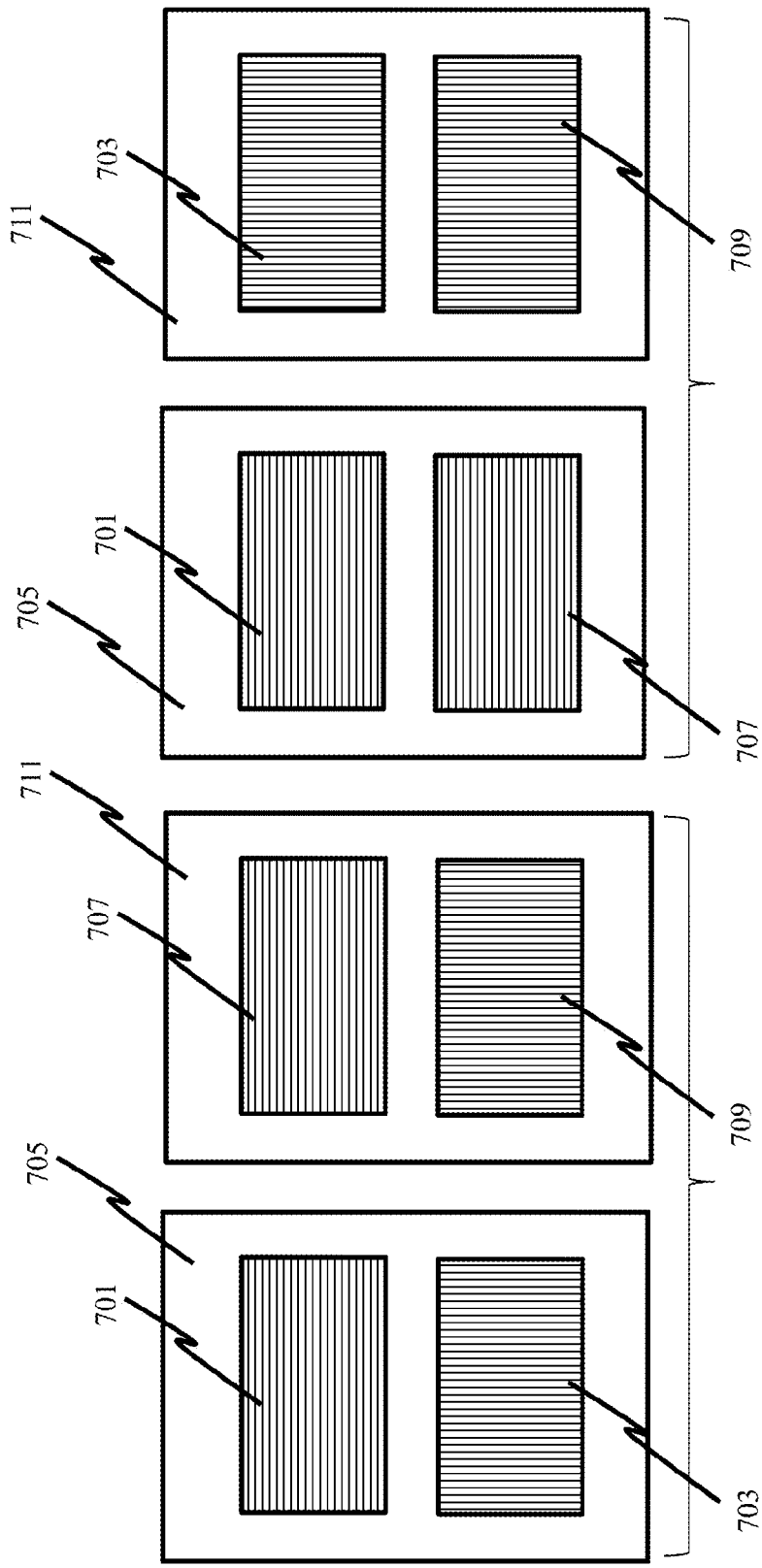
FIGS. 7A and 7B schematically illustrate conventional and optimized for overlay layouts, respectively, of double dipole layers for CTRs, in accordance with an exemplary embodiment.

Another area in which overlay is a concern is double dipole lithography (DDL). For DDL, dense circuit patterns are split into horizontal and vertical masks and then exposed sequentially using horizontally polarized light in one exposure followed by vertically polarized light in another. FIG. 7A illustrates a conventional pairing of layers for DDL according to the order of the half-layers in the process flow. As shown, a horizontal layout layer 701 and a vertical layout layer 703 for the 45 nm node are formed on the same MLR or CTR 705, one after the other, and a horizontal layout layer 707 and a vertical layout layer 709 for the half node (the 40 nm node) are formed on the next MLR or CTR 711. In this way, reticles do not have to be exchanged for the two sequential exposures, which is beneficial for wafer throughput. However, to improve overlay and reticle registration (and thereby again, wafer overlay) for double dipole layers of an MLR or CTR, the same design orientation images should be within one reticle (i) to have subsequent layers of the same node in the same image field, and (ii) to achieve a more homogeneous reticle patterning process. In other words, vertical layout orientation layers should be paired in one reticle for the X dipole exposure, and the horizontal layout orientation layers should be paired in another reticle for the Y dipole exposure, as illustrated in FIG. 7B. In FIG. 7B, the horizontal layout layer 701 for the 45 nm node is formed in the first image field of the first reticle, the horizontal layout layer 707 for the 40 nm node is formed in the second image field of the first reticle, the vertical layout layer 703 for the 45 nm node is formed in the first image field of the second reticle, and the vertical layout layer 709 for the 40 nm node is formed in the second image field of the second reticle. Thus, overlay and registration are improved for DDL.

The embodiments of the present disclosure can achieve several technical effects including reduced RT differences and improved MTT, CDU and registration on the reticle, improved flexibility of layer pairing for CTR and MLR, improved etch performance, improved CDU and registration for reticles with empty image fields, improved reticle CDU and registration for single layer reticles, and improved overlay performance of MLR and CTR. The present disclosure enjoys industrial applicability in any highly integrated semiconductor products/processes using MTR and CTRs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
providing a transmissive or reflective reticle having a frame area and a prime area, the frame area surrounding the prime area;
determining differences in RT (reticle transmission or reflection for a transmissive or reflective reticle, respectively) across the prime area; and providing disposable RT adjustment structures in the prime area in dummy filled regions on the reticle to decrease or increase the RT differences, wherein the reticle comprises a multilayer reticle (MLR), wherein determining RT differences comprises determining RT differences between different layers of the MLR, and wherein the RT is adjusted subsequent to a determination of an average RT tuning of respective layers of the MLR.

2. The method according to claim 1, wherein RT adjustment elements in the frame area differ in size from RT adjustment elements in the prime area.

3. The method according to claim 1, wherein:

determining RT differences comprises determining RT differences in different dies of a single image field; and providing RT adjustment structures comprises providing different numbers of RT adjustment elements in different dies.

4. The method according to claim 3, wherein providing RT adjustment structures further comprises providing RT adjustment elements at different locations within different dies.

5. The method according to claim 1, wherein providing RT adjustment structures comprises providing RT adjustment elements in an empty image field.

6. The method according to claim 5, further comprising providing RT adjustment elements in an area around the prime area of the empty image field.

7. A method comprising:

providing a transmissive or reflective reticle having a frame area and a prime area, the frame area surrounding the prime area;

determining differences in RT (reticle transmission or reflection for a transmissive or reflective reticle, respectively) across the prime area; and providing disposable RT adjustment structures in the prime area in dummy filled regions on the reticle to decrease or increase the RT differences, wherein the reticle comprises a cross technology reticle (CTR), wherein determining RT differences comprises determining RT differences between image fields of different technology nodes on the reticle, and wherein the RT is adjusted subsequent to a determination of layer pairing.

* * * * *